ized by a magentic winding upon application of each
United States Patent [19]

Schweitzer, Jr.

[11] Patent Number: 4,873,706
[45] Date of Patent: Oct. 10, 1989

[54] ELECTROMECHANICAL PULSE COUNTER

[76] Inventor: Edmund O. Schweitzer, Jr., 2433 Center St., Northbrook, Ill. 60062

[21] Appl. No.: 166,048

[22] Filed: Mar. 9, 1988

[51] Int. Cl.$^4$ .......................... G06M 3/14; G06M 1/10
[52] U.S. Cl. ........................................ 377/85; 377/86; 377/87; 377/88; 377/89
[58] Field of Search ..................... 377/82, 85, 86, 87, 377/88, 89, 90

[56] References Cited

U.S. PATENT DOCUMENTS

| | | | |
|---|---|---|---|
| 2,579,231 | 12/1951 | Goldberg et al. | 377/89 |
| 2,678,773 | 5/1954 | Glenn | 377/89 |
| 2,740,955 | 4/1956 | Barrett | 340/815.24 |
| 2,844,316 | 7/1958 | Liebknecht | 377/89 |
| 3,022,943 | 2/1962 | Dunn | 377/85 |
| 3,311,859 | 3/1967 | Bieger et al. | 340/815.24 |
| 3,403,272 | 9/1968 | Dold | 377/89 |
| 3,548,403 | 12/1970 | Johnson | 340/715 |
| 3,588,458 | 6/1971 | Walter et al. | 377/85 |
| 3,778,600 | 12/1973 | Burton | 377/85 |
| 3,793,510 | 2/1974 | Garbark | 377/85 |
| 4,234,847 | 11/1980 | Schweitzer | 324/146 |
| 4,273,994 | 6/1981 | Fleischer | 377/89 |
| 4,438,403 | 3/1984 | Schweitzer, Jr. | 324/133 |
| 4,495,489 | 1/1985 | Schweitzer, Jr. | 340/664 |

*Primary Examiner*—John S. Heyman
*Attorney, Agent, or Firm*—Lockwood, Alex, Fitzgibbon & Cummings

[57] ABSTRACT

An electromechanical pulse counter for counting applied current pulses includes a magnetizable disc-shaped armature mounted for rotation about a fixed axis. Magnetic stepping poles diametrically disposed adjacent the circumference of the armature are momentarily magnetized by a magentic winding upon application of each current pulse to establish diametrically opposed magnetic poles in the armature. Permanent indexing magnets diametrically disposed adjacent the circumference at an angular position relative to the stepping poles magnetically coact with the magnetic poles established in the armature following each current pulse to cause the armature to rotate to align the established magnetic poles with the poles of the indexing magnets. Each subsequent current pulse causes another pair of diametrically opposed magnetic poles to be established in the armature, and the armature to subsequently rotate to align the newly established magnetic poles with the indexing magnets. A pointer coupled to rotate with the armature indicates on an externally viewable scale from the total angular displacement of the armature the number of current pulses applied to the counter. The pointer is returned to its initial position by applying a series of current pulses of opposite polarity to the magnetic winding. Additional stepping poles may be provided on the opposite side of the indexing magnets for magnetization by an alternate source of current pulses to provide bidirectional up-down counting of applied pulses.

9 Claims, 7 Drawing Sheets

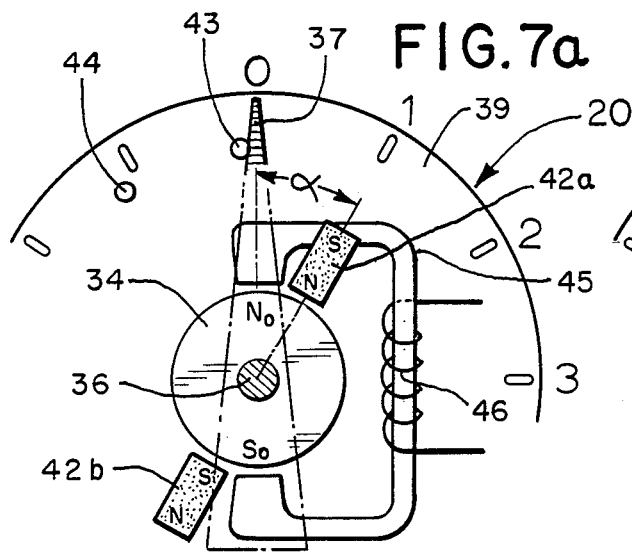
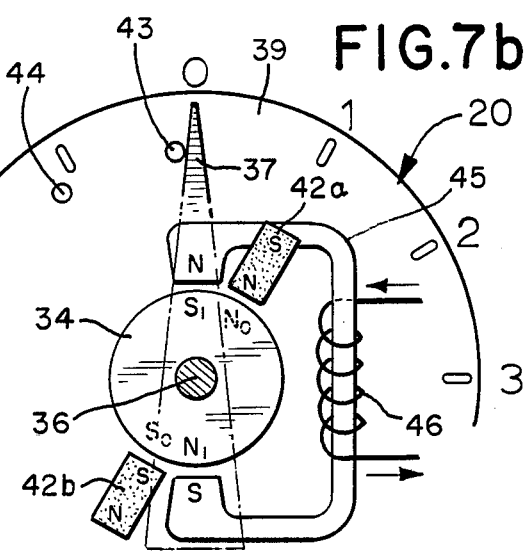
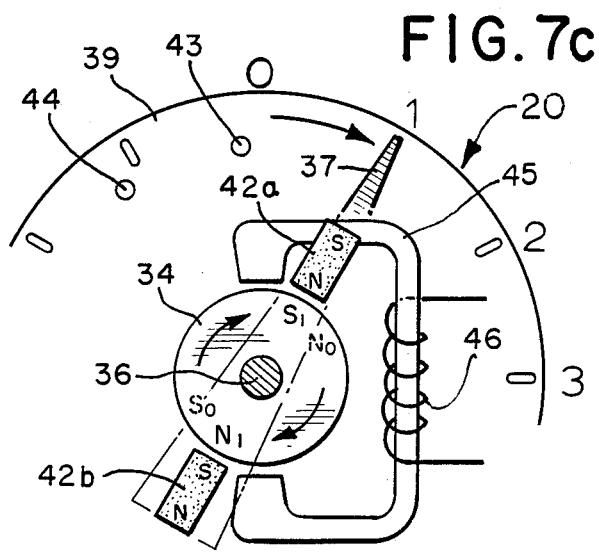
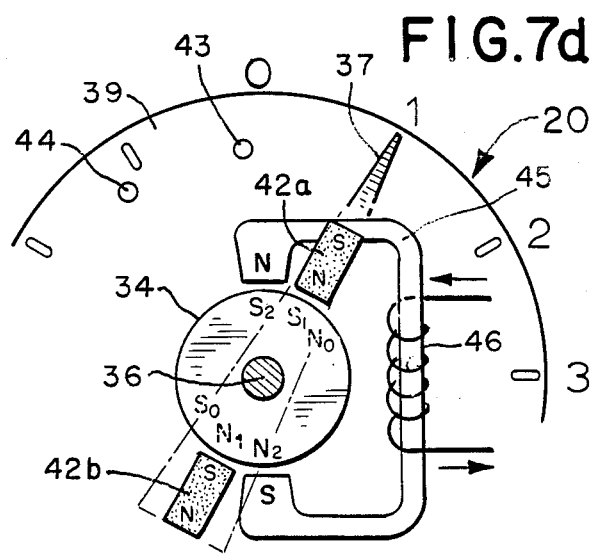
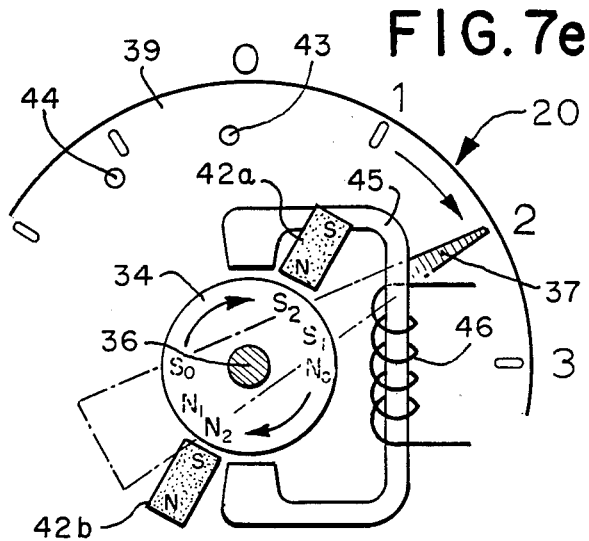
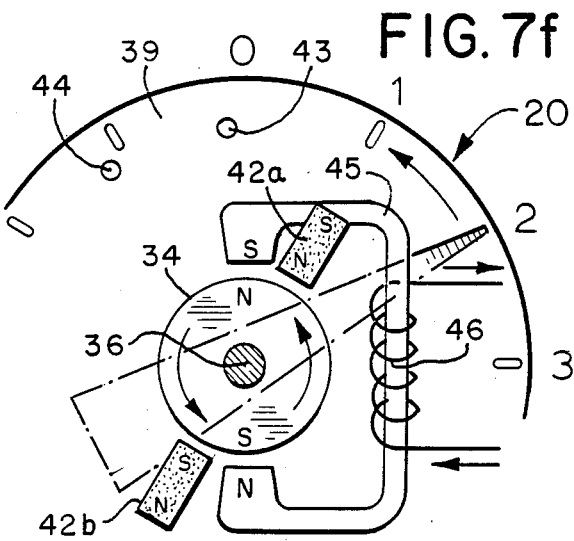

ELECTROMECHANICAL PULSE COUNTER

BACKGROUND OF THE INVENTION

The present invention is directed generally to pulse counters, and more particularly to an electromechanical pulse counter providing a high degree of reliability in adverse operating environments.

It is frequently necessary to indicate the number of occurrences of an electrical event, such as the occurrence of a fault current or a lightning strike, in a power distribution system. For example, a count may be required of the number of fault currents occurring over a period of time at an exposed relatively inaccessible location in the system to assist in locating the source of the fault. In such instances the counter utilized to count the fault occurrences must reliably operate in extremes of heat and cold and environmental contaminants, and must be readily viewable from a distance and without access to the counter.

Previously, counters employed for this purpose utilized a solenoid-actuated mechanism to drive a series of counter wheels on which indicia exposed through a viewing window indicated the number of occurrences of the electrical event being counted. Not only was this type of mechanism subject to malfunction from adverse environmental conditions, which tended to interfere with operation of the actuating mechanism, but the relatively large currents required to reliably actuate the mechanism were sometimes not readily available from the associated monitoring circuitry. A further disadvantage of such types of counters was that they were difficult to read from a distance and relatively expensive to manufacture, particularly when environmental conditions had to be taken into account.

The present invention is directed to an improved electromechanical pulse counter, which by avoiding the use of counter wheels and an associated solenoid actuator mechanism, provides a less costly and more reliable construction for use in adverse operating environments.

SUMMARY OF THE INVENTION

The invention is directed to an electromechanical counter for counting applied current pulses, comprising armature means mounted for movement in a forward direction from a reference position to at least first and second counting positions and responsive to a momentarily applied magnetic field to develop a pair of magnetic poles aligned with the axis of magnetization of the applied field, magnetizing means responsive to a first one of the applied current pulses for momentarily applying a magnetic field to the armature to establish a pair of magnetic poles therein, and indexing means for applying a magnetic field to the armature which coacts with the established magnetic poles to move the armature from the reference position to the first counting position. The magnetizing means is subsequently responsive to a second one of the applied current pulses to momentarily apply a magnetic field to the armature to establish a subsequent pair of magnetic poles therein, and the magnetic field applied by the indexing means subsequently coacts with the subsequently established magnetic poles to move the armature from the first counting position to the second counting position. Indicator means mechanically coupled to the armature indicate the number of current pulses applied to the counter.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIGS. 7a–7f are a series of diagrammatic views showing the interaction and operation of certain principal components of the electromechanical counter employed in the fault indicator.

FIGS. 15a14 15c are a series of diagrammatic views of certain principal components of the bidirectional counter illustrating operation of the counter in the down-count direction.

DESCRIPTION OF THE PREFERRED EMBODIMENT

Figure 1:
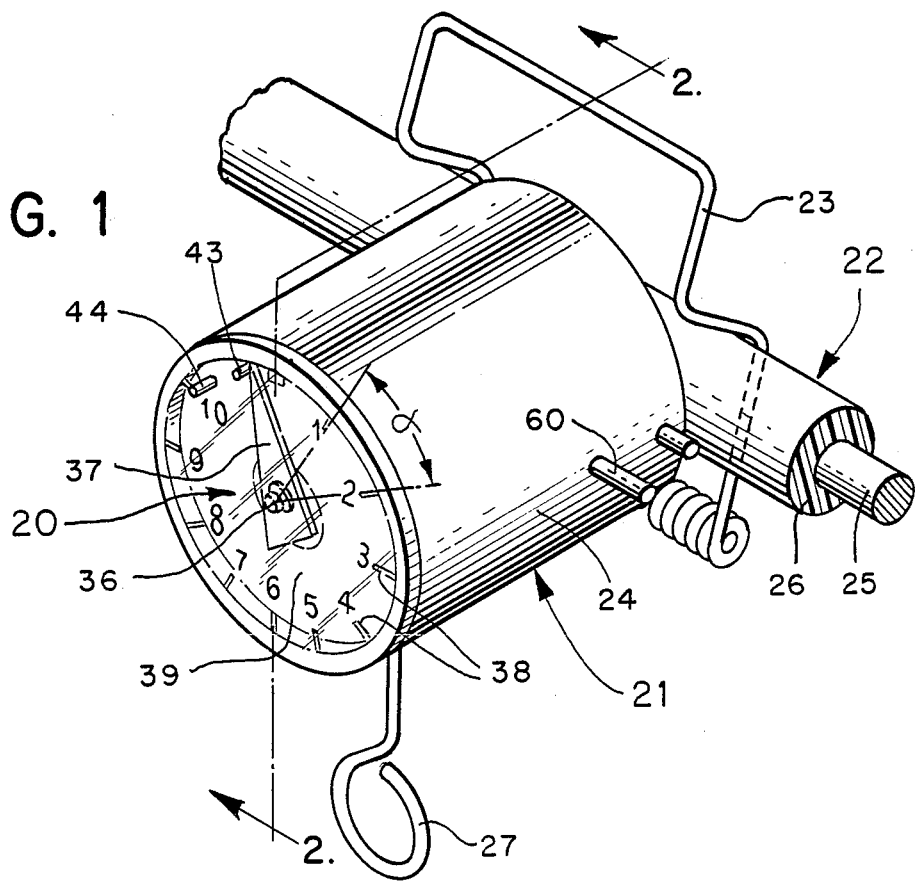
FIG. 1 is a perspective view of a cable-mounted potential-powered fault indicater incorporating an electromechanical counter constructed in accordance with the invention.

Referring to the Drawings, and particularly to FIGS. 1-6, an electromechanical counter 20 constructed in accordance with the invention may be advantageously employed within a cable-mounted fault indicator 21 as shown in FIG. 1. In accordance with conventional practice, fault indicator 21 is secured to an electrical cable 22 by means of an integral spring-biased clamp 23 which projects from the rear of the fault indicator housing 24. Cable 22, in accordance with conventional practice, may include a central electrical conductor 25 and a concentric insulating sheath 26. A downwardly extending hook 27 may be provided to facilitate installation and removal of the fault indicator on cable 22 and to provide electrical coupling to the electrical field associated with the conductor.

Figure 2:
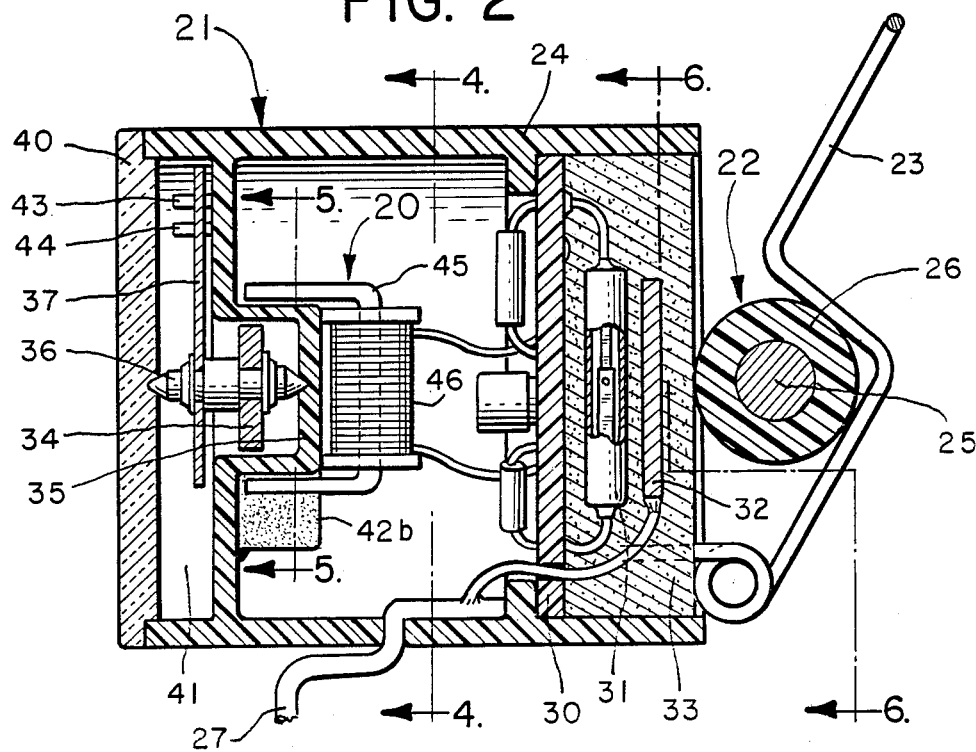
FIG. 2 is a cross-sectional view of the fault indicator taken along line 2—2 of FIG. 1.
Figures 3, 4, 5, 6:
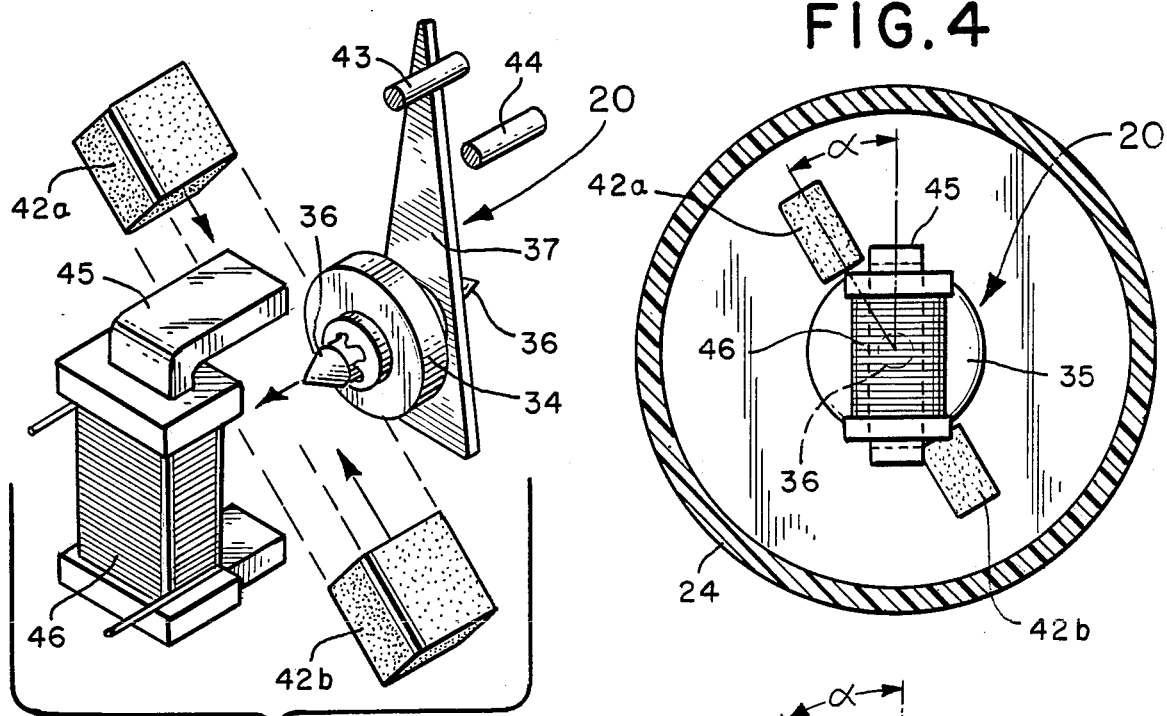
FIG. 3 is an enlarged exploded perspective view of certain principal components of the electromechanical counter employed in the fault indicator of FIG. 1.
FIG. 4 is a cross-sectional view of the fault indicator taken along line 4—4 of FIG. 2.
FIG. 5 is a cross-sectional view of the electromechanical counter of the fault indicator taken along line 5—5 of FIG. 2.
FIG. 6 is a cross-sectional view of the fault indicator taken along line 6—6 of FIG. 2.

Referring to FIG. 2, within housing 24 fault indicator 21 may include a wiring board 30 on which the various electrical components of the fault indicator are mounted. To detect the occurrence of a fault current in conductor 25, a reed switch 31 may be provided on the wiring board in general alignment with a plane perpendicular to the axis of conductor 25. To supplement the electrical coupling to the electrical field of conductor 25 provided by clamp 23 a flat metallic plate 32 may be provided in association with circuit board 30. A layer 33 of epoxy or other suitable sealing material may be provided between circuit board 30 and the open end of housing 24 to seal the interior of the housing against moisture and environmental contaminants.

To provide an indication of the number of times a fault current has occurred in conductor 25, fault indicator 21 includes within housing 24 the electromechanical pulse counter 20 of the invention. As shown in FIGS. 1-5, this counter includes a generally disc-shaped armature 34 mounted for rotation within an integral hub portion 35 of housing 24 on a shaft 36. A pointer 37 mounted on the exposed end of the shaft and coupled thereby for rotation with armature 34 indicates by means of indicia 38 on an integral face plate 39 a number of faults that have occurred. A transparent cover 40 is secured over the end of housing 24 to provide a closed chamber 41 within housing 24 in which armature 34, shaft 36 and pointer 37 are contained. The armature, shaft and pointer may be conveniently mounted by means of needle bearing surfaces at either end of the shaft which engage complementarily aligned recesses in hub portion 35 and cover 40.

Current pulses are provided to counter 20 by the circuitry of fault indicator 21 upon occurrence of a fault current in conductor 25. Prior to receipt of such a current pulse, pointer 37 is maintained in the initial "0" count-indicating position by indexing means in the form of a pair of permanent magnets 42a and 42b. These magnets, which are arranged at diametrically opposed locations relative to the axis of the disc-shaped armature 34 magnetically coact with induced magnetic poles in the armature such that the armature attempts to rotate in a clockwise direction, as viewed in FIGS. 3-5. A pin 43 projecting from scale 39 limits this clockwise rotation such that the pointer 37 is caused to point to the numeral "0". An additional projecting pin 44 may be provided to limit rotation of pointer 37, and hence armature 34, in the counter-clockwise direction.

Upon application of a current pulse to counter 20 armature 34 is remagnetized by magnetizing means comprising a generally U-shaped magnetic pole piece 45 and magnetic winding 46. The magnetic poles of pole piece 45 are situated about the circumference of armature 34 at an angular displacement $\alpha$ relative to the magnetic poles of permanent magnets 42a and 42b. The angular spacing between consecutive indicia 38 on scale 39 also corresponds to this angle, as shown in FIG. 1.

Referring to FIGS. 7a-7e, the counting of current pulses applied to counter 20 by the circuitry of fault indicator 21 occurs as a result of successive remagnetization of armature 34 and consequent rotational realignment of the armature following each current pulse. In particular, and with reference to FIG. 7a-7e, prior to application of a current pulse armature 34 is magnetized with the diametrically opposed poles $N_0$ and $S_0$ shown. The permanent indexing magnets 42a-42b function to repel these poles and in so doing to rotate armature 34 counter-clockwise (as viewed in FIG. 7a) against pin 43. Pointer 37 points "0" in this position, indicating to the user that no fault currents have occurred.

As shown in FIG. 7b, upon occurrence of a fault current and application of a current pulse to counter 20 magnetic winding 46 is energized by the current pulse to monentarily apply a magnetic field to armature 34 through magnetic poles piece 45. This causes armature 34 to be remagnetized to new diametrically opposed magnetic poles $S_1$ and $N_1$, as shown. Upon completion of the current pulse, as shown in FIG. 7c, armature 34 rotates to bring the magnetic axis of the new magnetic poles $S_1$ and $N_1$ into alignment with the magnetic axis of magnets 42a and 42b. This causes the rotatably coupled indicator needle 37 to point to the numeral "1" on scale 39, indicating that a current pulse has been received.

To preclude armature 34 from rotating to align the magnetic axis of its magnetic poles with the magnetic axis of magnetic poles 45 during the application of a current pulse, it is necessary that the applied current pulse be of sufficiently short duration and the inertia of armature 34 be sufficiently large. In practice, a relatively large armature mass is utilized with a pulse of very short duration, typically less than 1 millisecond.

A subsequent current pulse, as shown in FIG. 7d, causes remagnetization of armature 34 to new diametrically opposed magnetic poles $S_2$ and $N_2$. Upon completion of the subsequent pulse, armature 34 rotates to bring the magnetic axis of the new magnetic poles into alignment with the magnetic axis of permanent magnets 42a and 42b, as shown in FIG. 7e. Indicator needle 37 now points to the numeral "2" on scale 39, indicating that two current pules have been received.

To return the counter to a "0" counting state a series of count-down current pulses of opposite direction to the fault-indicating current pulses may be applied to magnetic winding 46. This causes armature 34 to be remagnetized with diametrically opposed poles of opposite gender. Permanent magnets 42a and 42b magnetically coact with these newly established poles to rotate armature 34 in a counter-clockwise direction, as shown in FIG. 7f. With subsequent count-down pulses armature 34 is repeatedly remagnetized and repelled by magnets 42a and 42b until indicator needle 37 is driven against pin 43 and the zero-indicating condition illustrated by FIG. 7a again exists.

Figure 8:
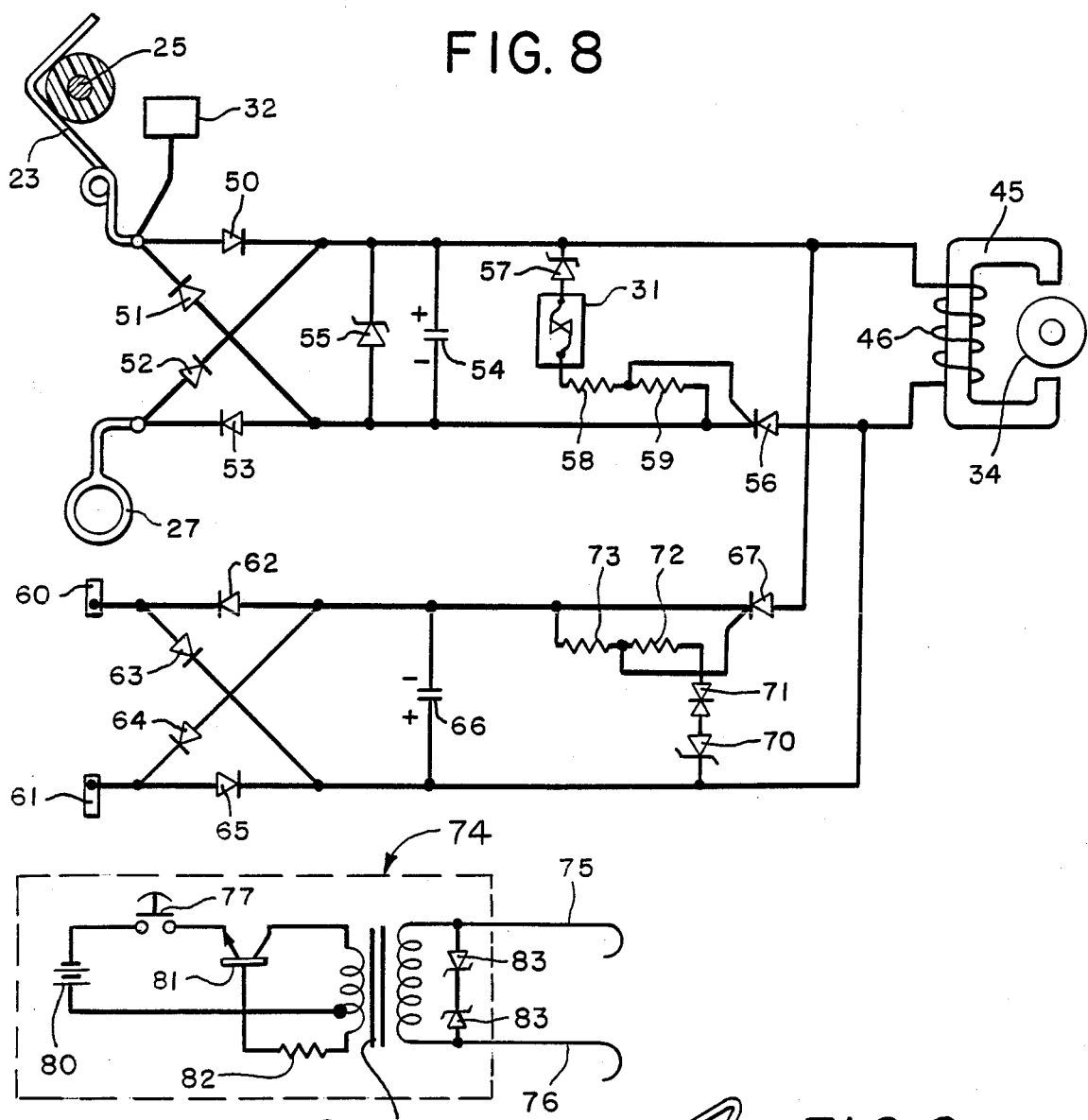
FIG. 8 is an electrical schematic diagram of the fault indicator of FIG. 1.

Referring to FIG. 8, fault indicator 21 may be powered by the potential gradient associated with conductor 25, coupling to the conductor being provided by clamp 23, plate 32, and the metallic hook 27 depending from the underside of the fault indicator housing. Alternating current thus derived from conductor 25 is rectified by a full-wave rectifier network comprising diodes 50-53 and applied to a capacitor 54 wherein a direct current for operating the fault indicator is developed. A zener diode 55 connected across capacitor 54 limits the voltage across the capacitor to a predetermined maximum level.

Capacitor 54 is connected to magnetic winding 46 through a silicon controlled rectifier (SCR) 56. Upon occurrence of a fault current resulting in closure of fault current-sensing contacts 31, SCR 56 is conditioned to a conductive state by current supplied through a current-limiting zener diode 57, switch 31 and resistors 58 and 59. This causes capacitor 54 to discharge into magnetic winding 46, generating a magnetic field in pole piece 45 which remagnetizes armature 34 in the manner previously described.

Return of armature 34 to its "0" count position is accomplished by a separate circuit powered from an alternating current applied to two reset terminals 60 and 61 located on housing 24. Alternating current applied to these terminals is rectified by a second full-wave bridge rectifier network comprising diodes 62–65 and applied to a capacitor 66 wherein a direct current is developed. Capacitor 66 is connected by a second SCR 67 to magnetic winding 46.

Upon initial application of an alternating current to terminals 60 and 61 capacitor 66 charges to a progressively increasing voltage. Eventually the voltage rises to a level where SCR 67 is rendered to conductive by a circuit consisting of a zener diode 70, an avalanche diode 71 and series-connected resistors 72 and 73. Capacitor 66 then discharges into magnetic winding 46 in a direction opposite to that of capacitor 54, and magnetic poles 45 apply a magnetic field of reverse direction to armature 34 to rotate the armature to its reset position, as previously described. As capacitor 66 discharges the voltage level across the capacitor eventually falls to a level wherein SCR 67 ceases to conduct, and capacitor 66 is then caused to recharge by the continued application of an alternating current to terminals 60 and 61. Eventually a voltage level is reached at which SCR 67 is again conditioned into conduction and another magnetic pulse is applied to armature 34. The process continues until a sufficient number of down-counting pulses have been applied to armature 34 to cause the armature to fully reset and the operator has removed excitation from terminals 60 and 61.

Figures 9, 10, 11:
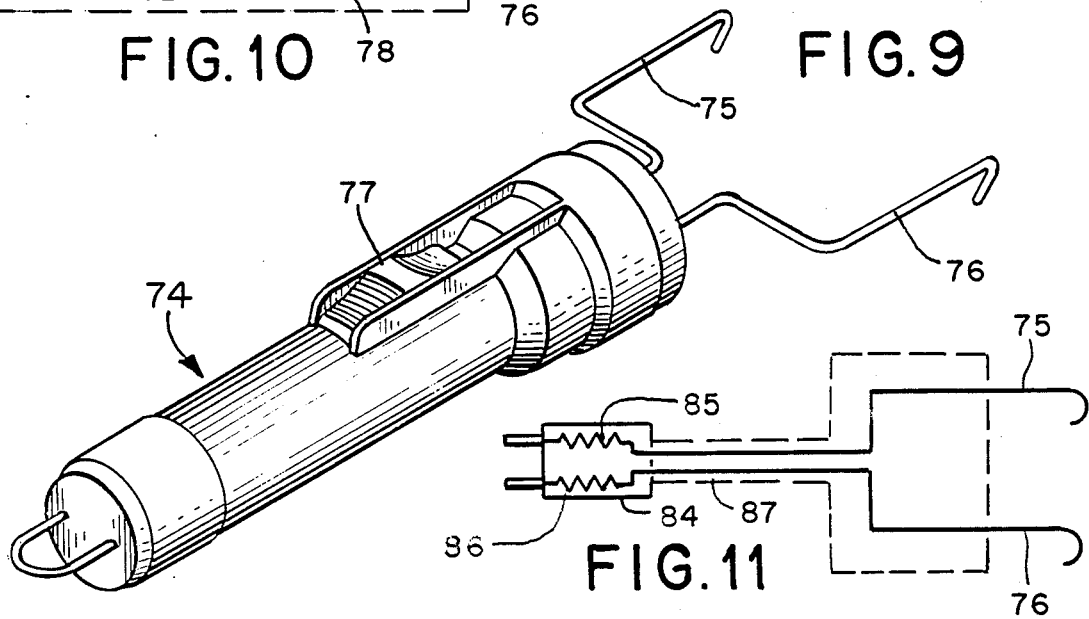
FIG. 9 is a perspective view of a reset tool for use in conjunction with the fault indicator of FIG. 1.
FIG. 10 is an electrical schematic diagram of the reset tool of FIG. 9.
FIG. 11 is an electrical schematic diagram of an alternate form of reset tool for use with the fault indicator of FIG. 1.

As shown in FIG. 9, excitation for the purpose of initiating a reset cycle may be conveniently applied to terminals 60 and 61 by means of a battery powered reset tool 74. Two wire electrodes 75 and 76 extending from the reset tool 74 at one end may be formed to engage the reset terminals. A user-actuated switch 77 may be provided to control the operation of the reset tool.

As shown in FIG. 10, the reset tool 74 may include a voltage step-up transformer 78. An alternating current is supplied to the primary of transformer 78 by a battery 80 and transistor 81. The transistor 81 may be connected by a resistor 82 to a winding segment on the primary winding such that the transistor oscillates. The secondary winding of transformer 78 may include zener diodes 83 for limiting the peak voltage applied to wire electrodes 75 and 76.

As an alternative to the battery powered reset tool 74, the AC line may be employed for this purpose. As shown in FIG. 11, an AC line plug 84 may be provided with isolation resistors 85 and 86 connecting the line through a cable 87 to wire electrodes 75 and 76. Upon application of a line current to plug 84 the isolated line voltage available at wire electrodes 75 and 76 is sufficient to charge capacitor 66 and accomplish a reset.

Figure 12:
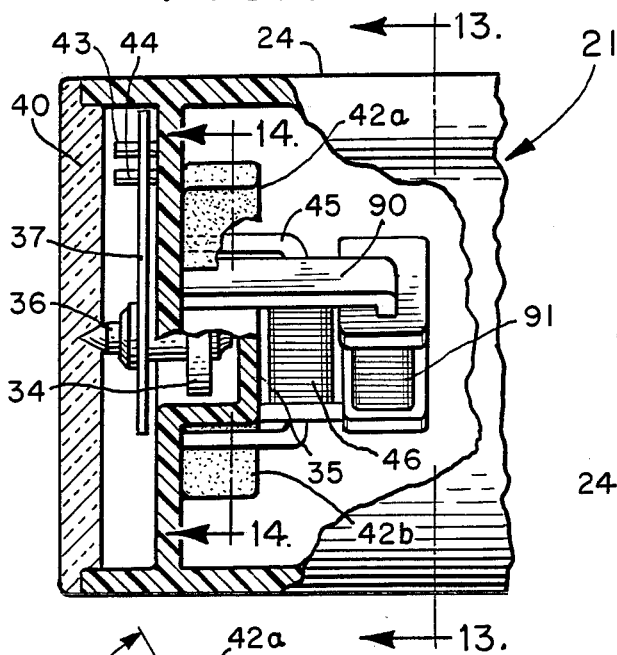
FIG. 12 is an enlarged perspective view of an alternate form of the invention capable of counting bidirectionally.
Figure 13:
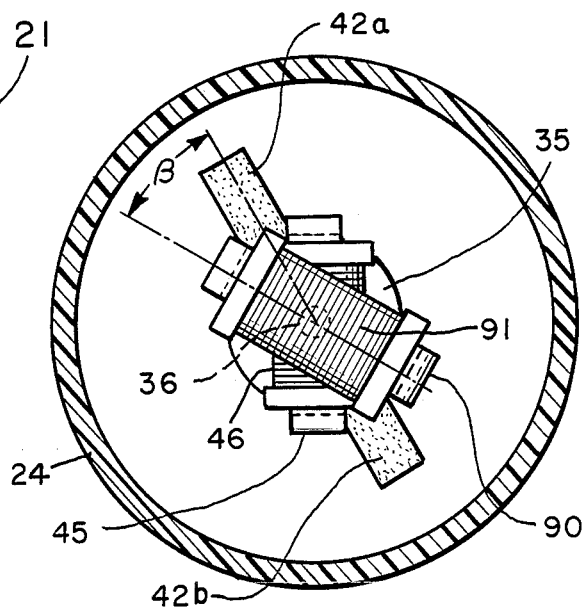
FIG. 13 is a cross-sectional view of the bidirectional counter taken along line 13—13 of FIG. 12.
Figure 14:
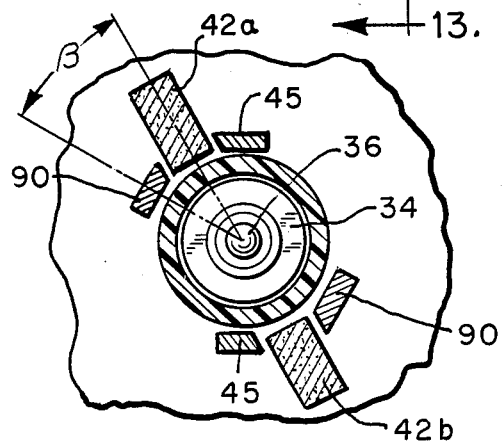
FIG. 14 is a cross-sectional view of the bidirectional counter taken along line 14—14 of FIG. 12.

In accordance with another aspect of the invention, an electromagnetic counter may be provided which counts both up and down with application of current pulses from different sources. In particular, with reference to FIGS. 12–14, reverse magnetizing means in the form of a second U-shaped magnetic pole piece 90 and magnetic winding 91 are arranged at an angle $\beta$ (FIGS. 13 and 14) relative to permanent magnets 42a and 42b.

Figure 15B:
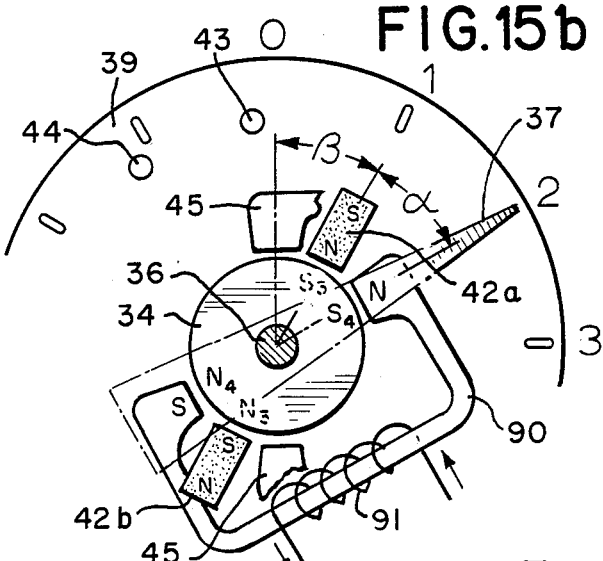
Figure 15A:
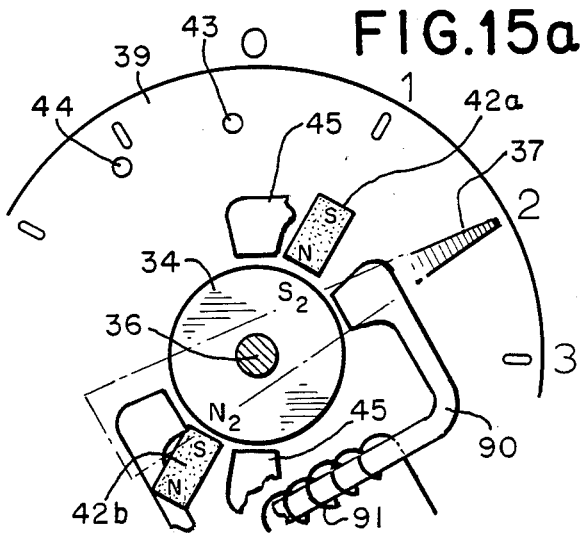
Figure 15C:
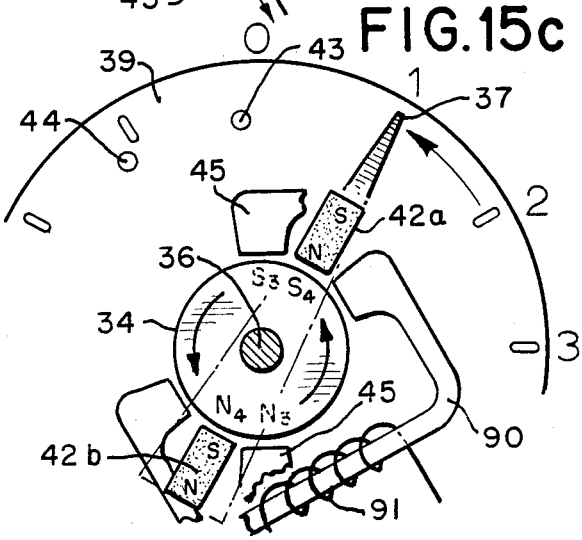

Referring to FIGS. 15a–15c, prior to application of a current pulse armature 34 is be positioned with the magnetic axis of magnetic poles $S_2$ and $N_2$ in alignment with the magnetic axis indexing magnets 42a and 42b. Subsequently, upon application of a current pulse to magnetic winding 91, pole piece 90 causes new diametrically opposed magnetic poles $S_4$ and $N_4$ to be formed on armature 34 as shown in FIG. 15b. Consequently, as shown in FIG. 15c, armature 34 rotates to bring the magnetic axis of the new magnetic poles $S_4$ and $N_4$ into alignment with the magnetic axis of indexing magnets 42a and 42b. As armature 34 turns counter-clockwise, indicator needle 37 moves from a "2" to a "1", indicating that one count has been subtracted from the total displayed by the counter. Subsequent pulses applied in a like direction to magnetic winding 91 cause similar incremental movements to armature 34 until indicator needle 37 abuts pin 43, indicating that the counter is in a "zero" counting state.

Thus, with the two magnetizing means shown in FIGS. 12–15 positioned on either side of the permanent magnet indexing means the counter can be caused to either count up from zero or down to zero depending on which magnetic winding receives a current pulse. Where angles $\alpha$ and $\beta$ are equal, as is the usual practice, the up count increments are equal to the down count increments of armature 34, and scale 39 indicates the net count.

Resetting of the counter to a zero counting state may be accomplished in the manner previously described with respect to FIG. 7f, or by the application of multiple down-count current pulses to winding 91.

Figure 16:
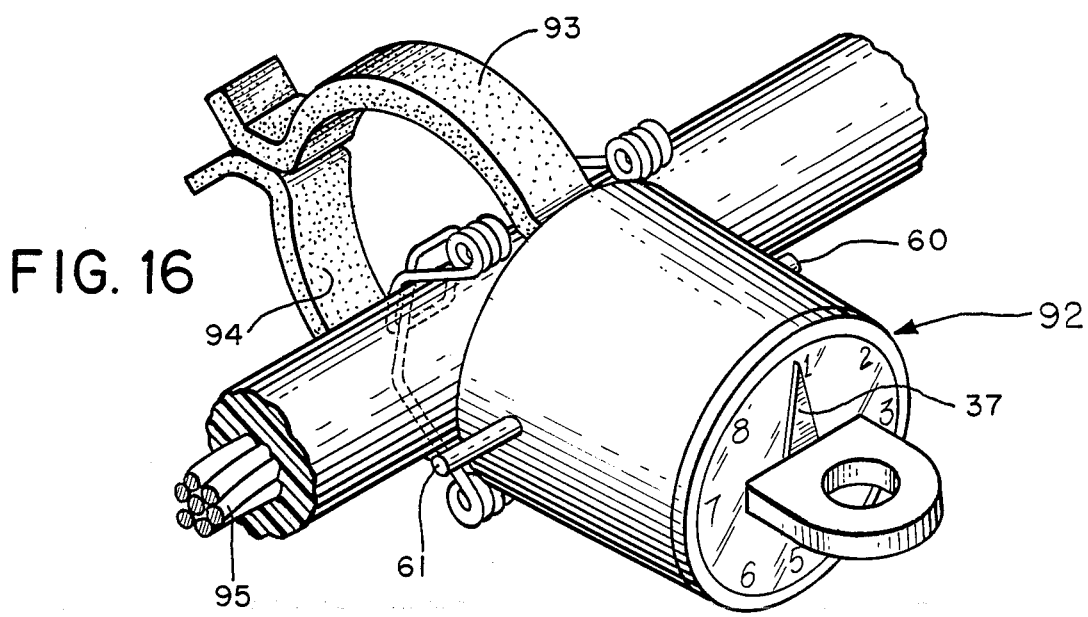
FIG. 16 is a perspective view of a cable-mounted current-powered fault indicator employing an electromechanical counter constructed in accordance with the invention.
Figures 17A, 17B:
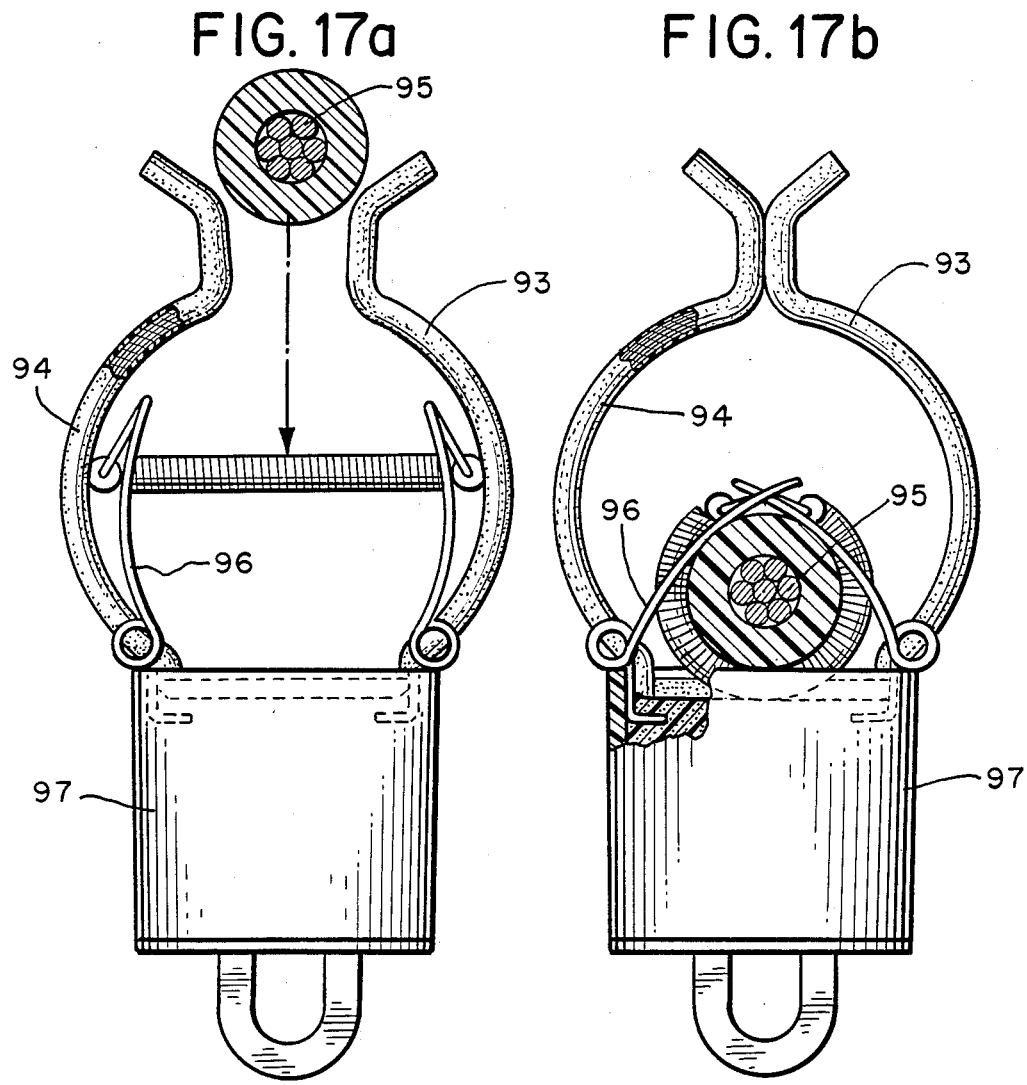
FIGS. 17a–17b are a series of side views of the fault indicator of FIG. 16 showing the installation thereof on a monitored electrical conductor.

The electromechanical counter 20 of the invention can be utilized in conjunction with other types of monitoring circuits, such as the current-actuated fault indicator 92 shown in FIG. 16. Instead of utilizing a potential coupling to the electric field of a monitored electrical conductor, fault indicator 92 utilizes a flexible magnetic core 93 which encircles a monitored conductor 95. A spring-biased clamp assembly 96 forces the conductor against the housing 97 of fault indicator 92 as shown in FIGS. 17a and 17b.

Figure 18:
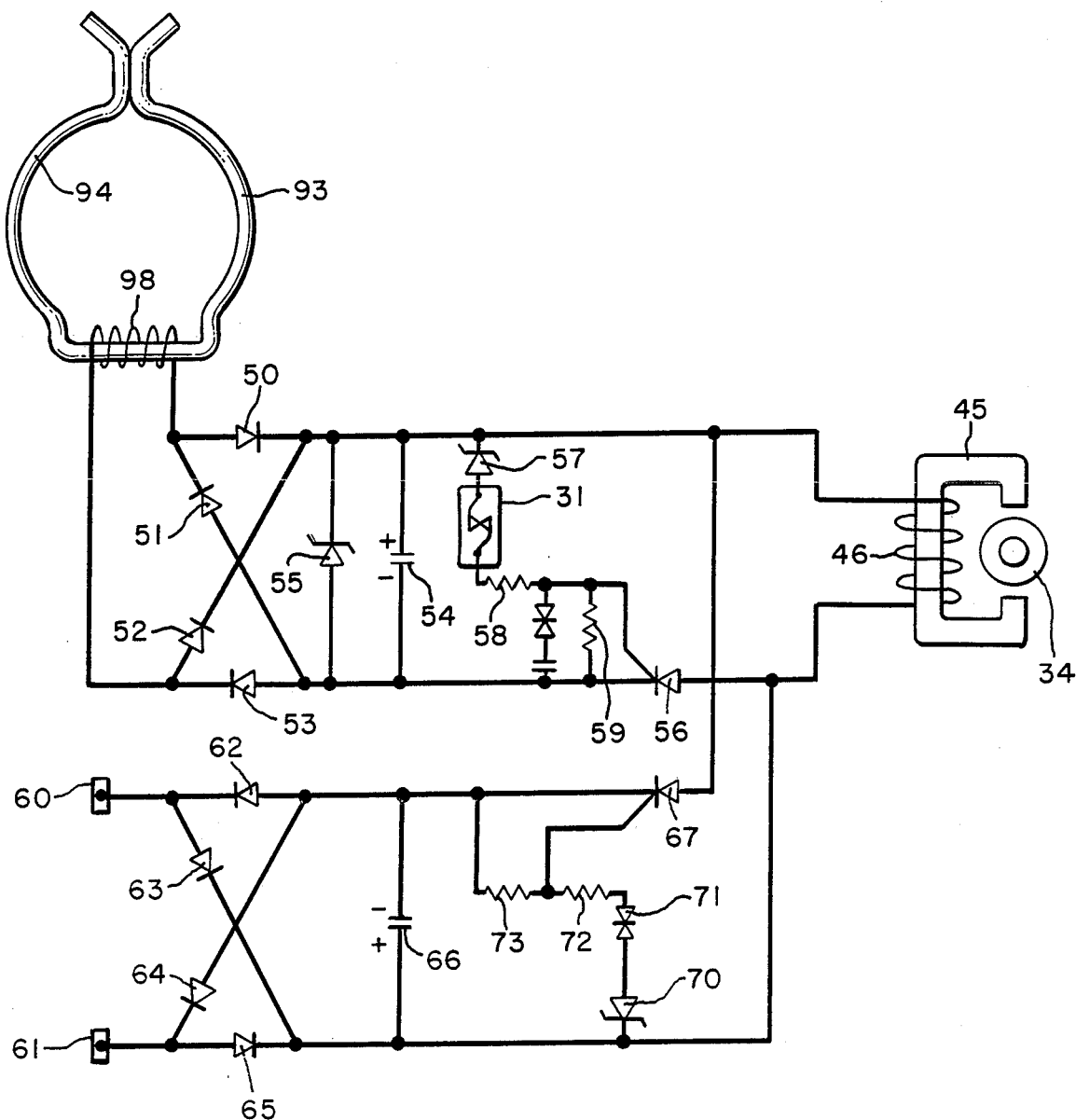
FIG. 18 is an electrical schematic diagram of the fault indicator of FIG. 16.

As shown in FIG. 18, the circuitry of fault indicator 92 may be similar to that of the previously described potential-coupled fault indicator 21, except that a winding 98 on core 93 is utilized to derive alternating current for application to the full-wave bridge rectifier network formed by diodes 50–53. A capacitor 99 prevents SCR 56 from conducting until capacitor 54 has been sufficiently charged by a fault current.

It will be appreciated that the electromagnetic counter of the invention is useful for counting randomly occurring pulses from a variety of sources, without the need for a complex mechanical actuator mechanism or for an external source of operating power. Furthermore, because of the large clock-like pointer and scale, the counter provides a highly legible display which can be accurately read at a distance, making the counter particularly useful in remote or inaccessible power distribution system installations.

In the bidirectional version of the counter shown in FIGS. 12–15 the counter may be utilized to add pulses received from one source and to subtract pulses received from another source. Various position indicating applications are possible for such a bidirectional counter, such as indicating the position of an elevator or a dumb-waiter without the need for position-sensing circuitry.

In either its unidirectional or bidirectional counting embodiments, the counter may be readily manufactured using conventional manufacturing techniques and materials. Armature 34 may be advantageously formed of 3.5 chromium magnet steel, magnetic poles 45 and 90 may be formed of silicon steel, and permanent magnets 42a and 42b may be formed of barium iron oxide ferrite. Housing 24 may be formed of a plastic material.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A bidirectional electromechanical counter for counting up in response to applied up-count current pulses, and down in response to applied down-count current pulses, comprising:
    armature means mounted for movement in forward and reverse directions to successive counting positions and responsive to a momentarily applied magnetic field to develop a pair of magnetic poles aligned with the axis of magnetization of the applied field;
    forward magnetizing means responsive to a first one of the up-count current pulses for momentarily applying a magnetic field to said armature to establish a pair of magnetic poles therein;
    reverse magnetizing means responsive to a first one of the down-count current pulses for momentarily applying a magnetic field to said armature to establish a pair of magnetic poles therein;
    indexing means for applying a magnetic field to said armature which coats with said established magnetic poles to move said armature to a succeeding counting position in the forward direction in response to magnetic poles established by said forward magnetizing means, and to a succeeding counting position in the reverse direction in response to magnetic poles established by said reverse magnetizing means;
    each of said magnetizing means being subsequently responsive to a second one of the applied current pulses for momentarily applying a magnetic field to said armature to establish a subsequent pair of magnetic poles therein;
    said magnetic field applied by said indexing means subsequently coacting with each said subsequently established magnetic poles to move said counting armature to a succeeding counting position in the respective direction; and
    indicator means mechanically coupled to said armature for indicating the number of current pulses applied to the counter.

2. A counter as defined in claim 1 wherein said forward magnetizing means is spaced on one side of said indexing means, and said reverse magnetizing means is spaced on the other side of said indexing means.

3. A counter as defined in claim 2 wherein the spacings between said forward magnetizing means and said indexing means, and between said reverse magnetizing means and said indexing means, are substantially equal.

4. A counter as defined in claim 1 wherein said armature is mounted for rotation about a fixed axis and the magnetic axis of said magnetizing means and said indexing means are angularly positioned about said fixed axis.

5. A counter as defined in claim 4 wherein said magnetic poles are diametrically opposed about said fixed axis.

6. A counter as defined in claim 5 wherein said armature is disc-shaped and said magnetic poles established therein are disposed around the circumference thereof.

7. A counter as defined in claim 2 wherein said indexing means comprise at least one permanent magnet.

8. A counter as defined in claim 1 wherein said magnetizing means each comprise a pair of magneticpoles, and a magnetic winding responsive to said applied current pulses for producing a magnetic field between said poles.

9. A counter as defined in claim 1 wherein said indicator means comprise a user-viewable pointer and scale.

* * * * *